(12) United States Patent
Peeters

(10) Patent No.: US 11,200,936 B2
(45) Date of Patent: Dec. 14, 2021

(54) READ-ONCE MEMORY

(71) Applicant: PROTON WORLD INTERNATIONAL N.V., Diegem (BE)

(72) Inventor: Michael Peeters, Tourinnes-la-Grosse (BE)

(73) Assignee: PROTON WORLD INTERNATIONAL N.V., Diegem (BE)

( * ) Notice: Subject to any disclaimer, the term of this patent is extended or adjusted under 35 U.S.C. 154(b) by 0 days.

(21) Appl. No.: 16/708,313

(22) Filed: Dec. 9, 2019

(65) Prior Publication Data
US 2020/0185018 A1    Jun. 11, 2020

(30) Foreign Application Priority Data

Dec. 10, 2018  (FR) ...................... 1872646

(51) Int. Cl.
| | | |
|---|---|---|
| G11C 11/00 | (2006.01) | |
| G11C 11/21 | (2006.01) | |
| H03K 19/20 | (2006.01) | |
| H03K 19/21 | (2006.01) | |

(52) U.S. Cl.
CPC .............. *G11C 11/21* (2013.01); *H03K 19/20* (2013.01); *H03K 19/21* (2013.01)

(58) Field of Classification Search
CPC ....... G11C 11/21; G11C 7/1066; G11C 16/22; G11C 7/106; G11C 7/24; H03K 19/20; H03K 19/21
USPC ........................................................ 365/154
See application file for complete search history.

(56) References Cited

U.S. PATENT DOCUMENTS

| | | | |
|---|---|---|---|
| 3,764,986 A * | 10/1973 | Spademan ................. | B41J 5/42 715/202 |
| 6,175,529 B1 * | 1/2001 | Otsuka .................... | G11C 29/14 365/200 |
| 7,218,567 B1 * | 5/2007 | Trimberger ............ | G11C 5/141 365/189.08 |
| 8,358,546 B2 * | 1/2013 | Kim ....................... | G11C 7/222 365/194 |
| 8,595,575 B2 * | 11/2013 | Do ......................... | G11C 29/40 714/731 |
| 9,509,313 B2 * | 11/2016 | Or-Bach ............ | H03K 19/1778 |
| 10,115,467 B2 | 10/2018 | Liu et al. | |
| 10,192,629 B2 | 1/2019 | Qiu et al. | |
| 10,242,747 B1 | 3/2019 | Patel | |
| 10,783,935 B2 | 9/2020 | Jeong | |
| 2004/0208058 A1 | 10/2004 | Narche | |
| 2013/0070519 A1 | 3/2013 | Lin et al. | |
| 2013/0286756 A1 | 10/2013 | Hadley | |
| 2014/0026232 A1 | 1/2014 | Lee et al. | |

(Continued)

FOREIGN PATENT DOCUMENTS

JP      2013-122797 A      6/2013

*Primary Examiner* — Tha-O H Bui
(74) *Attorney, Agent, or Firm* — Seed IP Law Group LLP

(57) ABSTRACT

A volatile memory circuit includes a first flip-flop, a second flip-flop having a set input coupled to an output of the first flip-flop. Logic circuitry of the memory circuit logically combines an output of the second flip-flop and information representative of the output of the first flip-flop to generate an output of the memory circuit. In response to a read command, the first flip-flop is reset and content of the second flip-flop is output by the circuit.

20 Claims, 8 Drawing Sheets

(56) References Cited

U.S. PATENT DOCUMENTS

| | | |
|---|---|---|
| 2014/0115243 A1 | 4/2014 | Lin et al. |
| 2014/0153349 A1 | 6/2014 | Wu et al. |
| 2015/0178143 A1 | 6/2015 | Mathew et al. |
| 2016/0180948 A1 | 6/2016 | Tanabe |
| 2016/0246967 A1 | 8/2016 | Gross et al. |
| 2017/0344295 A1 | 11/2017 | Sheffi et al. |

\* cited by examiner

READ-ONCE MEMORY

BACKGROUND

Technical Field

The present disclosure generally concerns electronic circuits and systems and more particularly the forming of a read-once or destructive readout memory.

Description of the Related Art

Memories are divided in several categories according to whether they are read only, rewritable, volatile, nonvolatile memories, as well as according to the technologies used (flash, EEPROM, SRAM, etc.)

A specific category of memories concerns so-called read-once or destructive or erasing readout memories. Such a memory is a memory or a storage element which has the feature that the reading out of the data that it contains causes its erasing.

This type of memory is particularly used in encryption processes in order to, for example, store one-time use information (typically, keys). They may also be used to form non-reversible counters.

BRIEF SUMMARY

In an embodiment, a volatile memory circuit comprises: a first flip-flop; a second flip-flop having a set input coupled to an output of the first flip-flop; and first logic circuitry, which, in operation, logically combines an output of the second flip-flop and information representative of the output of the first flip-flop. In an embodiment, the circuit comprises second logic circuitry, which, in operation, logically combines a readout control input and a cell programming control input. In an embodiment, the second logic circuitry includes circuitry of an XOR-type. In an embodiment, the first logic circuitry includes logic circuitry of an AND type, and, in operation, receives an inverted output of the first flip-flop. In an embodiment, an output of the second logic circuitry is coupled to a reset input of the first flip-flop. In an embodiment, the first logic circuitry includes logic circuitry of a NAND type. In an embodiment, an output of the second logic circuitry is coupled to a set input of the first flip-flop. In an embodiment, in operation, a reading of a state stored in the memory circuit triggers a forcing by the first logic circuitry of an output of the circuit to a constant state. In an embodiment, in operation, outputting a reading of content of the first flip-flop by the circuit is preceded by an erasing of the content of the first flip-flop. In an embodiment, an input of the first logic circuitry is coupled to a readout control input of the circuit. In an embodiment, the flip-flops are of RS type. In an embodiment, the circuit comprises a clock input coupled to clock inputs of the first and second flip-flops.

In an embodiment, a system comprises: one or more processing circuits; and one or more memories coupled to the one or more processing circuits, the one or more memories including a read-once memory circuit having a plurality of memory cells, each of the plurality of memory cells of the read-once memory including: a first flip-flop; a second flip-flop having a set input coupled to an output of the first flip-flop; and first logic circuitry, which, in operation, logically combines an output of the second flip-flop and information representative of the output of the first flip-flop to generate an output of the read-once memory. In an embodiment, the read-once memory circuit comprises second logic circuitry, which in operation, logically combines a readout control input of the read-once memory circuit and a cell programming control input of the read-once memory circuit. In an embodiment, the second logic circuitry includes an XOR gate. In an embodiment, an output of the second logic circuitry is coupled to respective reset inputs of the first flip-flops of the plurality of memory cells. In an embodiment, an output of the second logic circuitry is coupled to respective set inputs of the first flip-flops of the plurality of memory cells. In an embodiment, the first logic circuitry of a memory cell of the plurality of memory cells includes an AND gate, which, in operation, receives an inverted output of the first flip-flop of the memory cell of the plurality of memory cells. In an embodiment, the read-once memory, in operation, responds to receipt of a command to read content stored in the first flip-flops of the plurality of memory cells by: resetting the first flip-flops of the plurality of memory cells; and subsequently outputting content of the second flip-flops of the plurality of memory cells. In an embodiment, the read-once memory resets the second flip-flops of the plurality of memory cells after outputting the content of the second flip-flops of the plurality of memory cells.

In an embodiment, a method comprises: storing data in a first flip-flop of a memory cell; transferring the data to a second flip-flop of the memory cell, the second flip-flop having a set input coupled to an output of the first flip-flop; logically combining an output of the second flip-flop and information representative of the output of the first flip-flop to generate an output of the memory cell; and in response to receipt of a read command, resetting the first flip-flop; and outputting the data. In an embodiment, the method comprises logically combining a readout control input and a cell programming control input. In an embodiment, the method comprises resetting the second flip-flop after outputting the data.

An embodiment provides a volatile memory circuit, comprising:
  at least one first flip-flop;
  at least one second flip-flop having a set input coupled to an output of the first flip-flop; and
  a first logic function combining at least one output of the second flip-flop and information representative of the output of the first flip-flop.

According to an embodiment, the circuit comprises a second logic function combining a readout control input and a cell programming control input.

According to an embodiment, the second logic function is of XOR type.

According to an embodiment, the first logic function is of AND type, an input thereof, receiving the output of the first flip-flop, being inverted.

According to an embodiment, an output of the second logic function is coupled, and in some embodiments, connected, to the reset input of the first flip-flop.

According to an embodiment, the first logic function is of NAND type.

According to an embodiment, an output of the second logic function is coupled, and in some embodiments, connected, to the set input of the first flip-flop.

According to an embodiment, a reading out of the state stored in the memory circuit goes along with a forcing of an output of the circuit to a constant state.

According to an embodiment, a reading is preceded by an erasing of the content of the first flip-flop.

According to an embodiment, the first logic function also takes into account the state of a readout control input.

According to an embodiment, the flip-flops are of RS type.

According to an embodiment, the circuit comprises an input of application of a clock signal coupled to clock inputs of the flip-flops.

An embodiment provides a read-once volatile memory.

According to an aspect, an embodiment provides a memory circuit comprising:
at least one rewritable non-volatile memory cell; and
a circuit for erasing the memory cell on reception of a readout request.

According to an embodiment, the circuit comprises at least one flip-flop having a set input coupled to an output of the cell.

According to an embodiment, the circuit comprises a logic function combining at least one output of the flip-flop and the cell output.

According to an embodiment, the logic function also takes into account a state indicative of a readout order.

According to an embodiment, the logic function is of AND type, an input thereof, receiving the output of the memory cell, being inverted.

According to an embodiment, the flip-flop is of RS type.

According to an embodiment, the circuit comprises a logic function combining the output of the cell with a state indicative of a readout order.

According to an embodiment, the logic function is of AND type.

According to an embodiment, a reading out of the state stored in the cell is followed by a forcing of an output of the circuit to a constant state.

According to an embodiment, a reading is preceded by a programming of the memory cell to a determined state.

According to an embodiment, the memory cell is of the type which is blank in the high state.

According to an embodiment, the circuit comprises an input of application of a clock signal coupled to a clock input of the memory cell and, to a clock input of the erasing circuit.

According to an embodiment, the clock signal is applied to a clock input of the flip-flop.

An embodiment also provides a non-volatile erasing readout memory.

An embodiment also provides a method of controlling a memory circuit comprising at least one rewritable nonvolatile memory cell, comprising, during a readout step, the step of causing an erasing of the memory cell before delivering its content.

The foregoing and other features and advantages of various embodiments will be discussed in detail in the following non-limiting description of specific embodiments in connection with the accompanying drawings.

DETAILED DESCRIPTION

Figure 1:
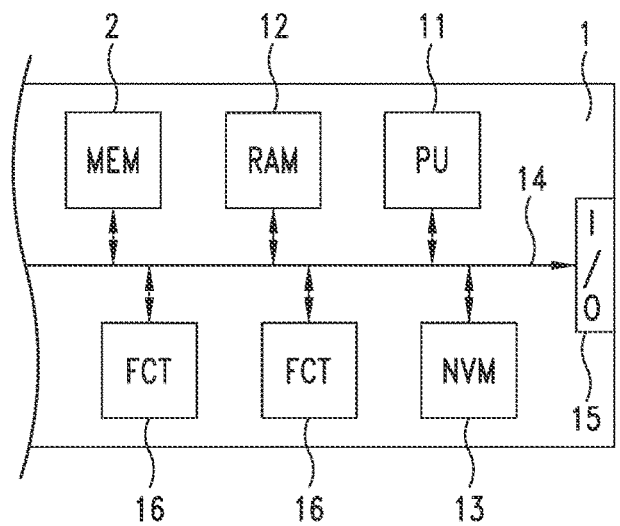
FIG. 1 very schematically shows in the form of blocks an embodiment of an electronic circuit of the type to which the described embodiments may apply.

In the following description, certain details are set forth in order to provide a thorough understanding of various embodiments of devices, systems, methods and articles. However, one of skill in the art will understand that other embodiments may be practiced without these details. In other instances, well-known structures and methods associated with, for example, circuits, such as transistors, multipliers, adders, dividers, comparators, memory cells, integrated circuits, logic gates, finite state machines, convolutional accelerators, memory arrays, interfaces, bus systems, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to." Reference to "at least one of" shall be construed to mean either or both the disjunctive and the inclusive, unless the context indicates otherwise.

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure.

The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not necessarily intended to convey any information regarding the actual shape of particular elements, and have been selected solely for ease of recognition in the drawings.

The same elements have been designated with the same reference numerals in the different drawings, unless the context indicates otherwise. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the forming of a rewritable memory cell has not been detailed, the described memory circuit being compatible with usual memory cells, for example, of flash, EEPROM, or other type. Further, the applications using destructive readout memories have not been detailed either, the described embodiments being compatible with usual applications.

Throughout the present disclosure, the term "connected" is used to designate a direct electrical connection between circuit elements with no intermediate elements other than conductors, whereas the term "coupled" is used to designate an electrical connection between circuit elements that may be direct (e.g., connected), or may be via one or more intermediate elements.

In the following description, reference will be made to "0" and "1" to designate respectively low and high logic states of the digital signals. Unless otherwise specified, state 0 represents the inactive state of a control signal.

The terms "about", "substantially", "approximately", and "in the order of" are used herein to designate a tolerance of plus or minus 10%, of plus or minus 5%, of the value in question.

FIG. 1 very schematically shows, in the form of blocks, an embodiment of an electronic circuit 1 of the type to which the described embodiments may apply.

Electronic circuit 1 comprises:
one or a plurality of digital processing units (PU) 11, for example, of state machine, microprocessor, programmable logic circuit, or other type of processing circuitry;
one or a plurality of memories 12, 13 of volatile (RAM) and/or non-volatile (NVM) memory for data and program storage;
one or a plurality of data, address, and/or control buses 14 between the different elements internal to circuit 1;
one or a plurality of input/output interfaces 15, (I/O) of wired or wireless communication with the outside of circuit 1; and
various other circuits according to the application and having various functions, symbolized in FIG. 1 by block 16 (FCT).

According to the shown embodiment, circuit 1 comprises a destructive readout memory 2 (MEM). Memory 2 is a volatile or non-volatile memory according to embodiments. Memory 2 has the specificity that the reading of information that it contains causes the erasing of this information. More particularly, a feature of the described embodiments is that the data stored in memory 2 are only output (delivered) once the circuit provides for the erasing of these data from the memory.

Figure 2:
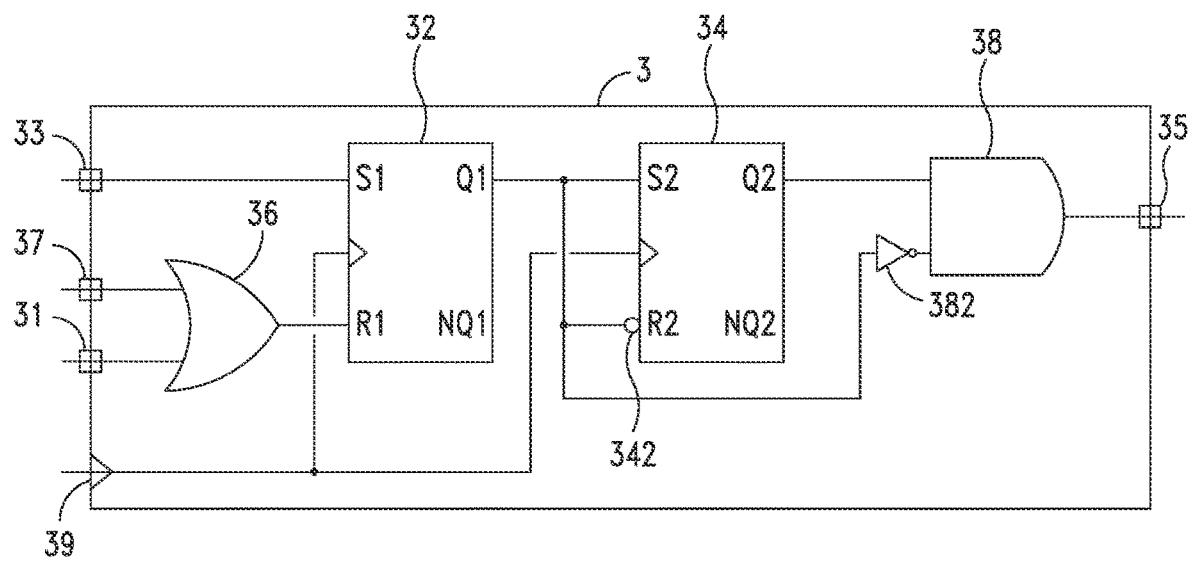
FIGS. 2 and 2A very schematically show embodiments of a destructive readout memory circuit.
Figure 2A:
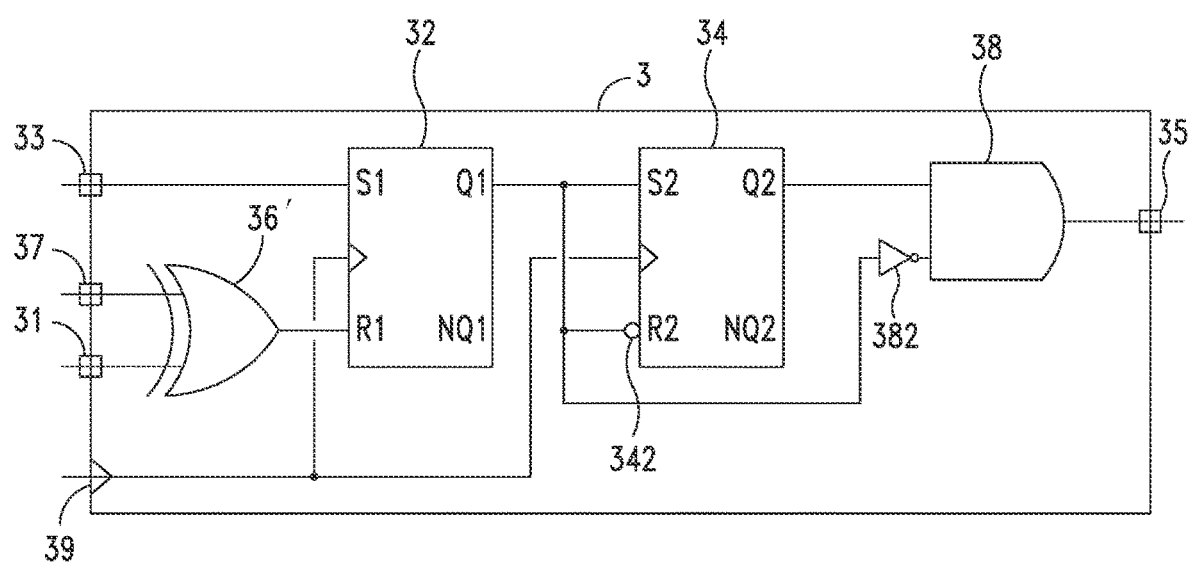

FIGS. 2 and 2A very schematically show embodiments of a destructive readout memory circuit 3.

Circuit 3 of FIG. 2 forms an elementary circuit of a bit of memory 2 of FIG. 1. In other words, memory 2 comprises a number of circuits 3 which depends on the application and on the number of memory bits which are desired to be of destructive readout type. As a variation, certain elements of circuit 3 are shared, that is, are common to a plurality of bits of memory 2, a memory circuit representing a word of a plurality of bits (for example, 8, 16, 32, 64).

The embodiment of FIG. 2 concerns the forming of a volatile storage memory circuit, based on flip-flops 32, and 34, for example, of RS type.

A bit of circuit 3 comprises at least:
a first flip-flop 32;
a second flip-flop 34; and
a logic output function 38.

Circuit 3 further comprises, for each bit or shared by a plurality of bits:
a logic input function 36.

To simplify explanations, the case of one circuit 3 per bit is considered hereafter (non-shared version). However, the sharing of certain elements does not change the basic operation of an embodiment.

Thus, circuit 3 comprises, in the same way as a rewritable memory cell, a readout control terminal 31, a terminal 33 for controlling a programming to a state 1, a data output terminal 35 and, optionally, a terminal 37 for controlling an erasing or a programming to a state 0. Circuit 3 comprises a terminal 39 of application of a sequencing or clock signal of flip-flops 32 and 34.

Flip-flops 32 and 34 output, in the idle state, states 0 on their respective outputs Q1 and Q2. Each flip-flop 32, 34 comprises a set input S1, respectively S2, a reset input R1, respectively R2, and a sequencing or clock input.

The elements and definitions given hereabove in relation with the description of FIG. 2 are common to the embodiments based on flip-flops to form a volatile storage destructive (or erasing) readout memory circuit.

In the embodiments of FIGS. 2 and 2A, input SI of flip-flop 32 is coupled, or connected, to terminal 33 for controlling a programming of a state 1. Input RI of flip-flop 32 is coupled, or connected, to the output of logic function 36. Logic function 36 is, in the shown example of FIG. 2, a combination of OR-type (OR gate) or as shown in FIG. 2A, of XOR type (XOR gate) 36', with two inputs, respectively coupled, or connected, to readout control terminal 31 and to terminal 37 for controlling a programming of a state 0. When function 36 is an OR-type function, the readout control is considered to hold the priority. According to another variation, the readout and programming signals are gathered on a single input of circuit 3 and function 36 is then omitted.

The (direct or non-inverted) output Q1 of flip-flop 32 (functionally corresponding to a data output of a storage element) is coupled, or connected, to input S2 of flip-flop 34. Output Q1 is further coupled, for example, by an inverter 342, to input R2 of flip-flop 34. The input and the output of inverter 342 are then respectively coupled, or connected, to output Q1 and to input R2. As a variation, the inversion of output signal Q1, for its application to input R2, is performed by the use of an inverted reset input of flip-flop 34. According to another variation, the inverted output NQ1 of flip-flop 32 coupled, or connected, to input R2, is used.

The (direct or non-inverted) output Q2 of flip-flop 34 is combined with the inverse of output Q1 of flip-flop 32 by logic function 38. Function 38 performs, in the shown example, an AND-type combination (AND gate) of its two inputs. The inversion of the signal sampled from output Q1 of flip-flop 32 is symbolized by an inverter 382 coupling output Q1 of flip-flop 32 to an input of function 38, but output NQ1 may for example also be used. The output of function 38 is coupled, or connected, to output terminal 35 of memory circuit 3.

In the embodiment of FIG. 2, the inverted output NQ2 of flip-flop 34 is not used.

Functionally, flip-flop 32 corresponds to the storage element (the element which stores the data) and flip-flop 34 is used for the reading and contains the same value as flip-flop 32, with an offset of one clock cycle.

Figure 3:
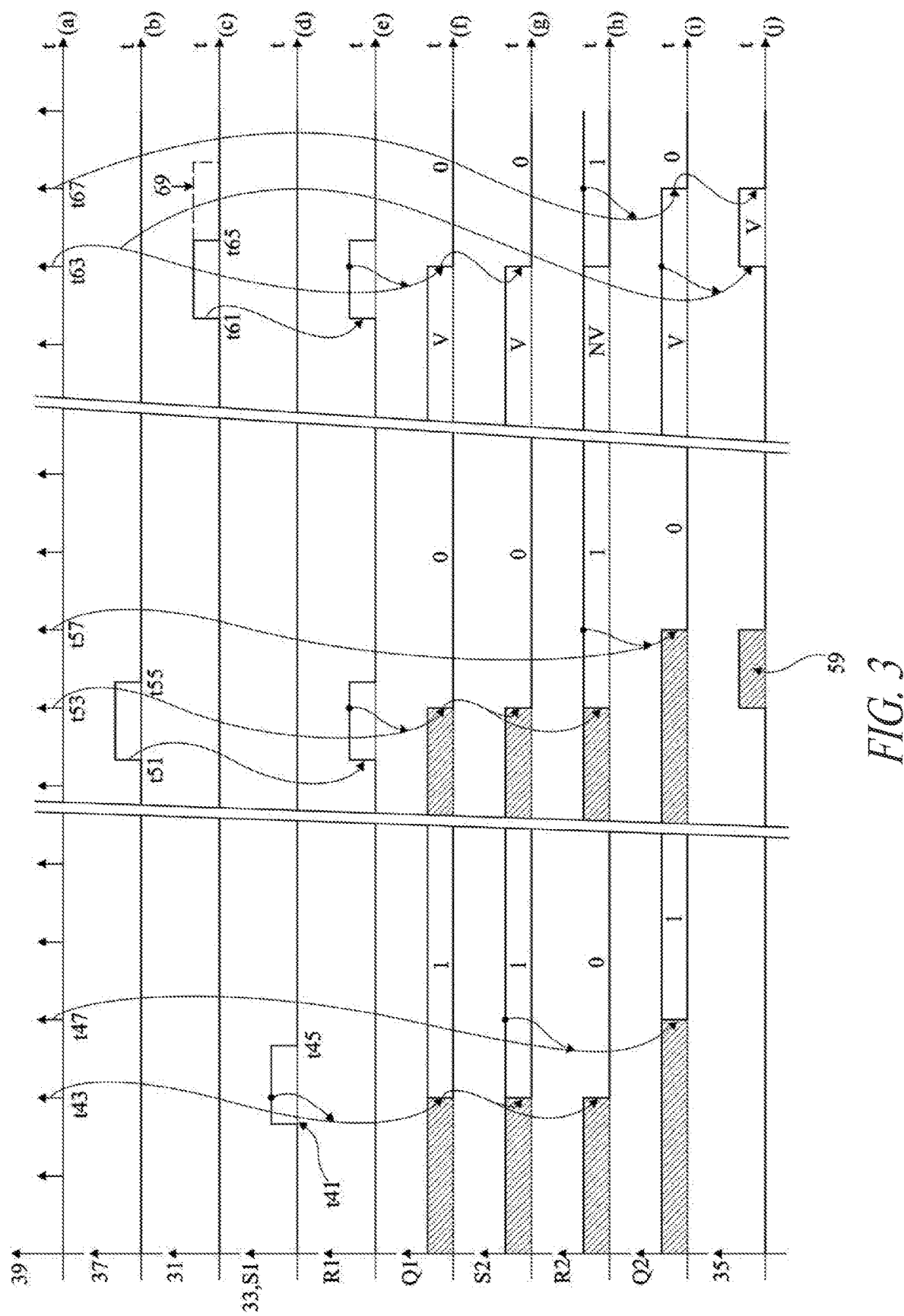
FIG. 3 illustrates, in timing diagrams, an example of the operation of the embodiments of FIGS. 2 and 2A.

FIG. 3 illustrates, in the form of timing diagrams, the operation of memory circuit 3 of FIG. 2.

Signal 3(a) shows an example of a trigger signal CK, applied to terminal 39. Signal 3(b) shows an example of a signal for controlling the programming to state 0 (or erasing), applied to terminal 37. Signal 3(c) shows an example of a readout control signal applied to terminal 31. Signal 3(d) shows an example of a signal for controlling a programming to state 1, applied to terminal 33, corresponding to input terminal S1 of flip-flop 32. Signal 3(*e*) shows the output state of gate 36 or of input R1 of flip-flop 32. Signal 3(*f*) shows the content of memory cell 32, that is, the state of output terminal Q1 of flip-flop 32. Signal 3(*g*) shows the corresponding state of input terminal S2 of flip-flop 34. Signal 3(*h*) shows the corresponding state of input terminal R2 of flip-flop 34. Signal 3(*i*) shows the corresponding state of terminal Q2 of flip-flop 34. Signal 3(*j*) shows the corresponding state of output terminal 35.

It is assumed that signal CK activates flip-flops 32 and 34 on a rising edge. Accordingly, flip-flop 32 takes into account the states of the signals present on inputs S1 and R1 at each rising edge to define the state of the memory cell, and thus sets the state of terminal Q1. Similarly, flip-flop 34 takes into account the states of the signals present on inputs S2 and R2 at each rising edge to set the state of output Q2.

In the embodiment of FIG. 2 where a volatile memory cell is present, the content thereof is set by an initial programming cycle, after the powering-on of the electronic circuit which integrates the cell. Signal CK is not necessarily a periodic signal but may be a trigger signal. Indeed, an edge on signal CK generating a taking into account of the respective states of the inputs of flip-flops 32 and 34, such an edge can thus appears when an intentional operation is performed (setting to 1, resetting to 0, reading).

The left-hand portion of FIG. 3 illustrates an example of operation for a programming to a state 1. The central portion of FIG. 3 illustrates an example of operation for a programming to a state 0. The right-hand portion of FIG. 3 illustrates an example of operation during a reading.

Initially (at the powering-on), all the signals of FIG. 3 are normally in the low state (0), particularly the signals applied to terminals 31, 33, 37, and 39, and thus signals S1 and R1. With all these signals at state 0, output 35 is forced to state 0 at latest after two cycles (rising edges of the signal applied to terminal 39). However, to take into account the fact that, during a programming, the content may have already been set by a previous programming, undetermined or indifferent states are symbolized by hatched areas.

It is considered that memory cell 3 starts by being programmed either to a state 1, or to a state 0. In the absence of a programming, in the example of FIG. 3, the cell supplies its erasing value, that is, state 0.

To program the cell to state 1 (left-hand portion of FIG. 3), a high state (1) to be programmed is applied (time t41) to input 33. This state is transferred to input S1 of flip-flop 32. At the next triggering edge (time t43), state 1 is read by flip-flop 32 from its input S1 and is transferred to output Q1 of flip-flop 32, and thus to input S2 of flip-flop 34. Further, the inverse, that is, state 0, is transferred to input R2. At the next rising edge of the trigger signal (time t47), the value 1 read from input S2 is transferred to output Q2. However, output 35 remains in the low state due to the low state present on the second input of gate 38. In the example of FIG. 3, it is assumed that the high state on input 33 disappears at a time t45, intermediate between times t43 and t47. However, it may also remain, and the programming will simply be confirmed in the same state at each edge of the trigger signal. To be taken into account, the programming signal should however be present at least at the first edge of the trigger signal which follows its occurrence. In simple fashion, assuming that the trigger signal is a periodic or clock signal, the programming signal (programming to state 1 on input 33 or to state 0 on input 37) is applied for a duration at least equal to one period and, in an embodiment, of one period. The stored state remains stable as long as no reading, power cut-off, or programming to state 0 (erasing) occurs. In particular, RS flip-flops being considered, they keep state 1 at their output as long as they have not been reset by their respective inputs R1 and R2.

To program the cell to state 0 (central portion of FIG. 3), a high state (1) is applied (time t51) on input 37 to reset flip-flop 32. This state is transferred to input R1 of flip-flop 32. At the next triggering edge (time t53), state 1 is read out by flip-flop 32 from its input R1 and a state 0 is thus forced at output Q1 of flip-flop 32, and thus on input S2 of flip-flop 34. Further, the inverse, that is, state 1, is transferred to input R2. At the next rising edge of the trigger signal (time t57), the value 1 read from input R2 forces output Q2 to state 0. Output 35 thus remains in the low state. It is here also assumed that the high state on input 37 disappears at a time t55 intermediate between times t53 and t57. However, here again, this state may also remain. Similarly, in the same way as for the programming to state 1, in order to be taken into account, the signal of programming to state 0 should however be present at least at the first edge of the trigger signal which follows its occurrence. Here again, the stored state remains stable (until a reading, a programming to state 1, or a power cut-off).

To perform a reading from circuit 3 (right-hand portion of FIG. 3), a state 1 is applied (time t61) to input 31. This state is transferred to input R1. At the next triggering edge (time t63), state 1 is read out by flip-flop 32 from its input R1 and a state 0 is thus forced on output Q1 of flip-flop 32, and thus on input S2 of flip-flop 34. Further, the inverse, that is, state 1, is transferred to input R2. Meanwhile, the stored state V, which is present on output Q2, is transferred to the output of gate 38, by the switching to state 1 of input R2 (if output Q2 is at state 0, the result of the AND combination provides 0, if output Q2 is at 1, the result of the AND combination provides 1). It should be noted that, before time t63, input R2 provides inverse NV of the value V stored in the cell. At the next rising edge of the trigger signal (time t67), the value 1 read from input R2 forces output Q2 to state 0. This erases the output value which, whatever the previous state, takes the low state. It is here again assumed that the readout signal is only present for a duration corresponding to one cycle and thus disappears at a time t65 intermediate between times t63 and t67. As in the previous cases, it may however remain.

It should be noted that, in the embodiment illustrated in FIGS. 2 and 3, the data or value V present at output 35 should be taken into account by the downstream circuits at latest at time t67. Indeed, after this time, value V is erased. One cycle is thus available to take into account the read state.

It should be noted that, in the example of FIGS. 2 and 3, the operation in readout mode is identical to the operation in a mode of resetting to state 0. In other words, between states t53 and t57, output signal 35 actually takes the value of output Q2 (hatched area 59 in the central portion of FIG. 3). Thus, if a programming to state 0 follows a programming to state 1 without for a reading to have occurred therebetween, output 35 temporarily takes state 1. This amounts to saying that, in the embodiment of FIG. 2, there is no reading otherwise than by an erasing.

Figure 4:
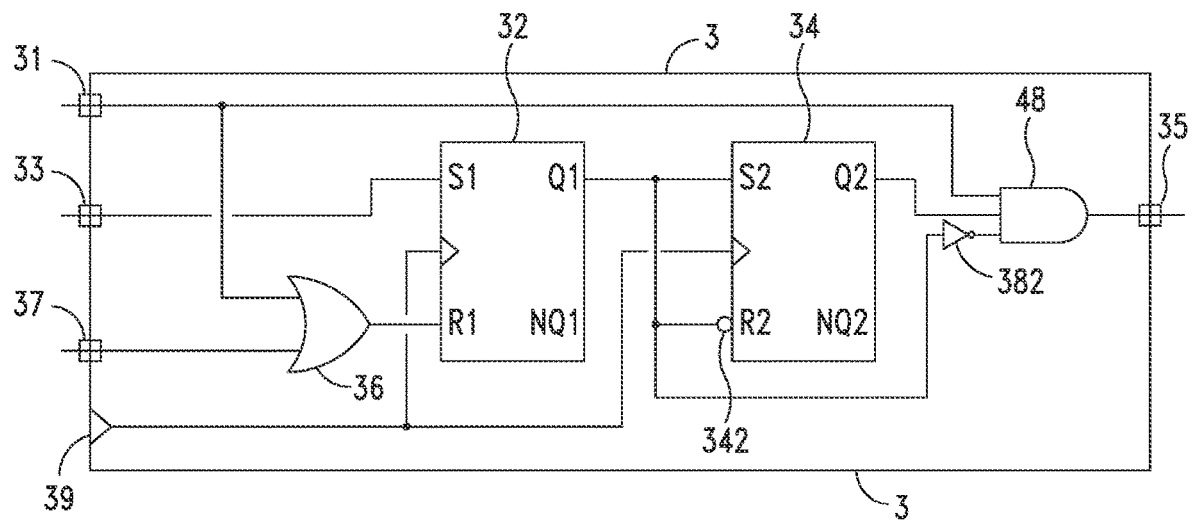
FIGS. 4 and 4A very schematically show embodiments of a destructive readout memory circuit.
Figure 4A:
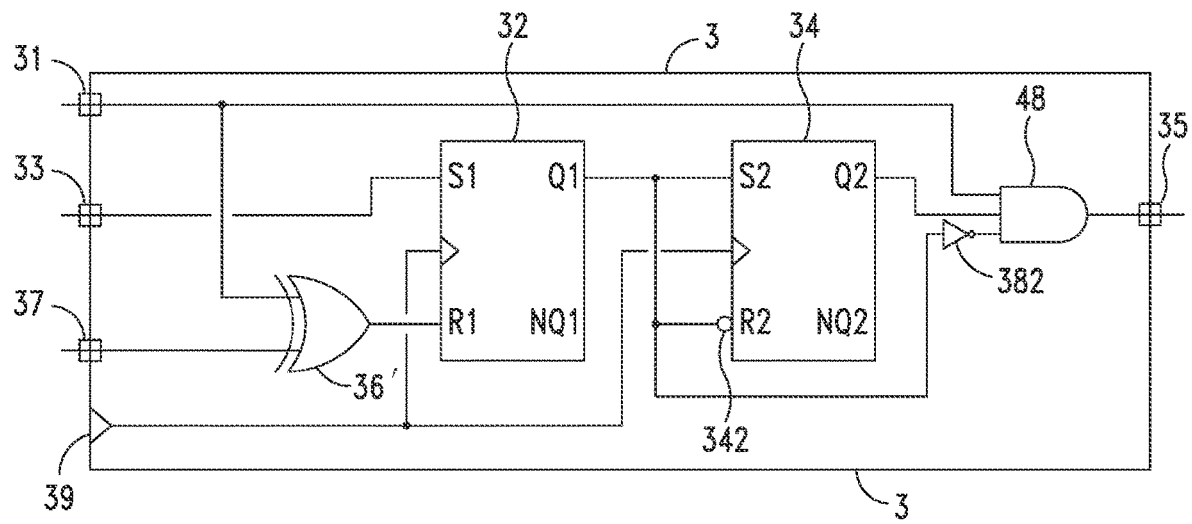

FIGS. 4 and 4A very schematically show embodiments of a destructive readout or erasing readout memory circuit.

The embodiment of FIG. 4 enables to avoid the situation of the embodiment of FIG. 2 where a programming to state zero is equivalent to a reading.

As compared with the circuit of FIG. 2, AND function or gate 38 is replaced with a three-input AND function or gate 48 and its third input receives the readout control signal, that is, it is coupled, or connected, to terminal 31. The rest of the circuit is identical to that discussed in relation with FIG. 2.

The operation is similar to that discussed in relation with FIG. 2, with two differences.

A first difference is that the readout situation in case of a programming to state 0 (area 59 in FIG. 3) can no longer occur. Indeed, the readout control signal being in the low state, it forces output 35 to the low state during programming phases and more generally, outside of any period when the signal applied to terminal 31 is in the high state.

A second difference is that the readout control signal applied to terminal 31 should be maintained for at least two cycles. Indeed, since value V is only supplied at time t67, the third input of gate 48 should also be at state 1 at time t67. This duration is illustrated by dotted lines 69 in FIG. 3(c).

Figure 5:
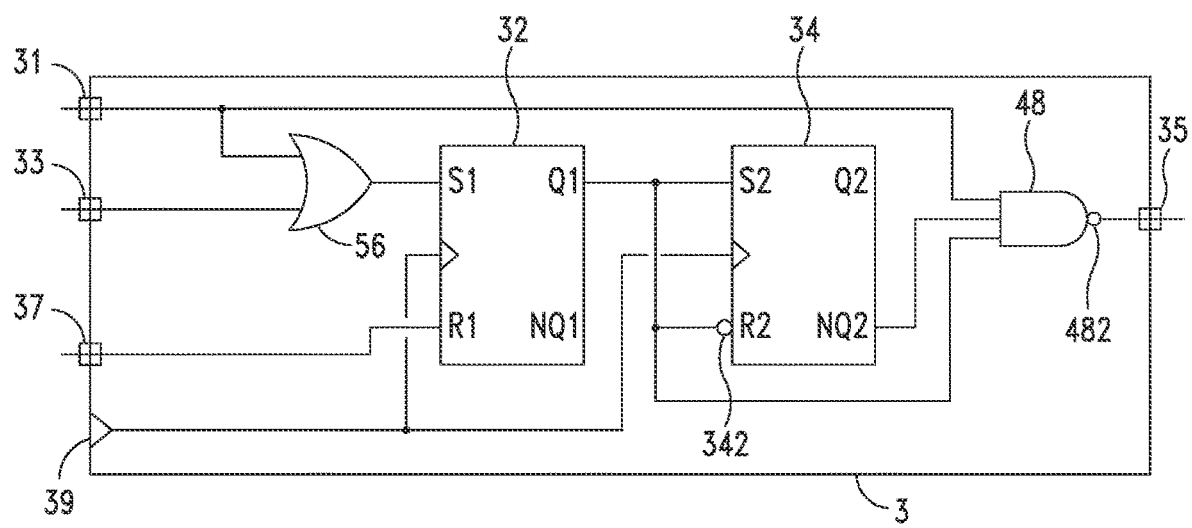
FIGS. 5 and 5A very schematically show embodiments of a destructive readout memory circuit.
Figure 5A:
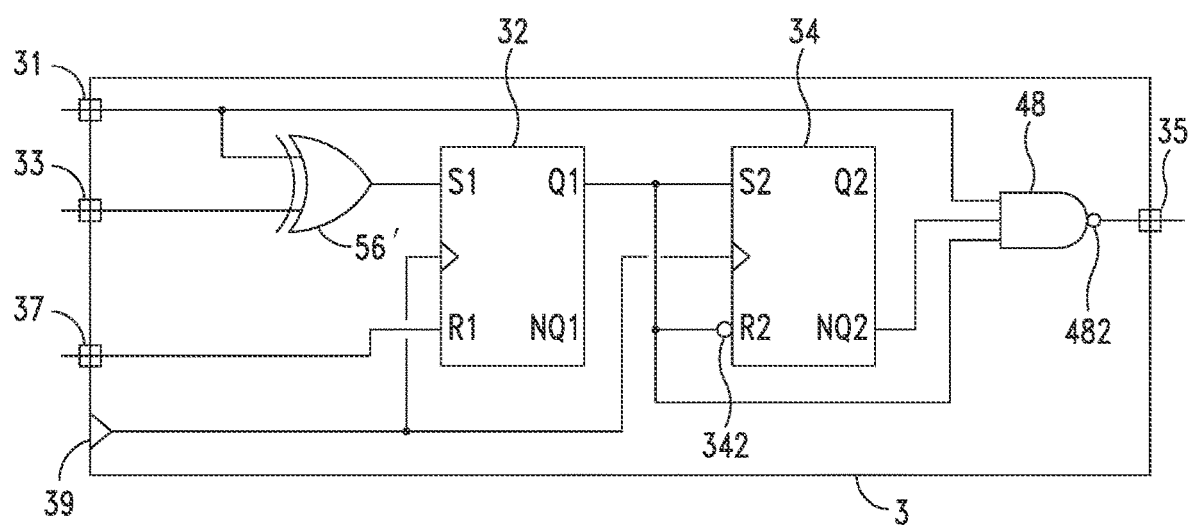

FIGS. 5 and 5A very schematically show embodiments of a destructive or erasing readout memory circuit.

As compared with the embodiment of FIG. 4:

inverter 382 is suppressed, output QI being coupled, or connected, with no inversion to AND gate 48;

the output state of AND gate 48 is inverted before being supplied to terminal 35 (for example, by a different inverter 482 or by replacing gate 48 with a NAND-type gate);

gate 36, 36' is replaced with an XOR-type (or OR-type) function 56, 56' or gate which combines the state of the readout control signal (terminal 31) with the state of the signal of programming to state I (input 33); and only the signal for controlling the programming to state 0 is taken into account by input RI of flip-flop 32 (input RI is coupled, or connected, to terminal 37).

In terms of operation, the difference with the embodiment of FIG. 4 is that the erased state, that is, the state present at output 35 in the idle state, is the high state. This operation can be deduced from the discussion performed in relation with the previous drawings.

The embodiment illustrated in FIG. 5 may also as a variation use a two-input AND gate as gate 48. The operation is then close to that discussed in relation with FIG. 3, but this time, it is a programming to state 1 which has the same behavior as a reading.

Figure 6:
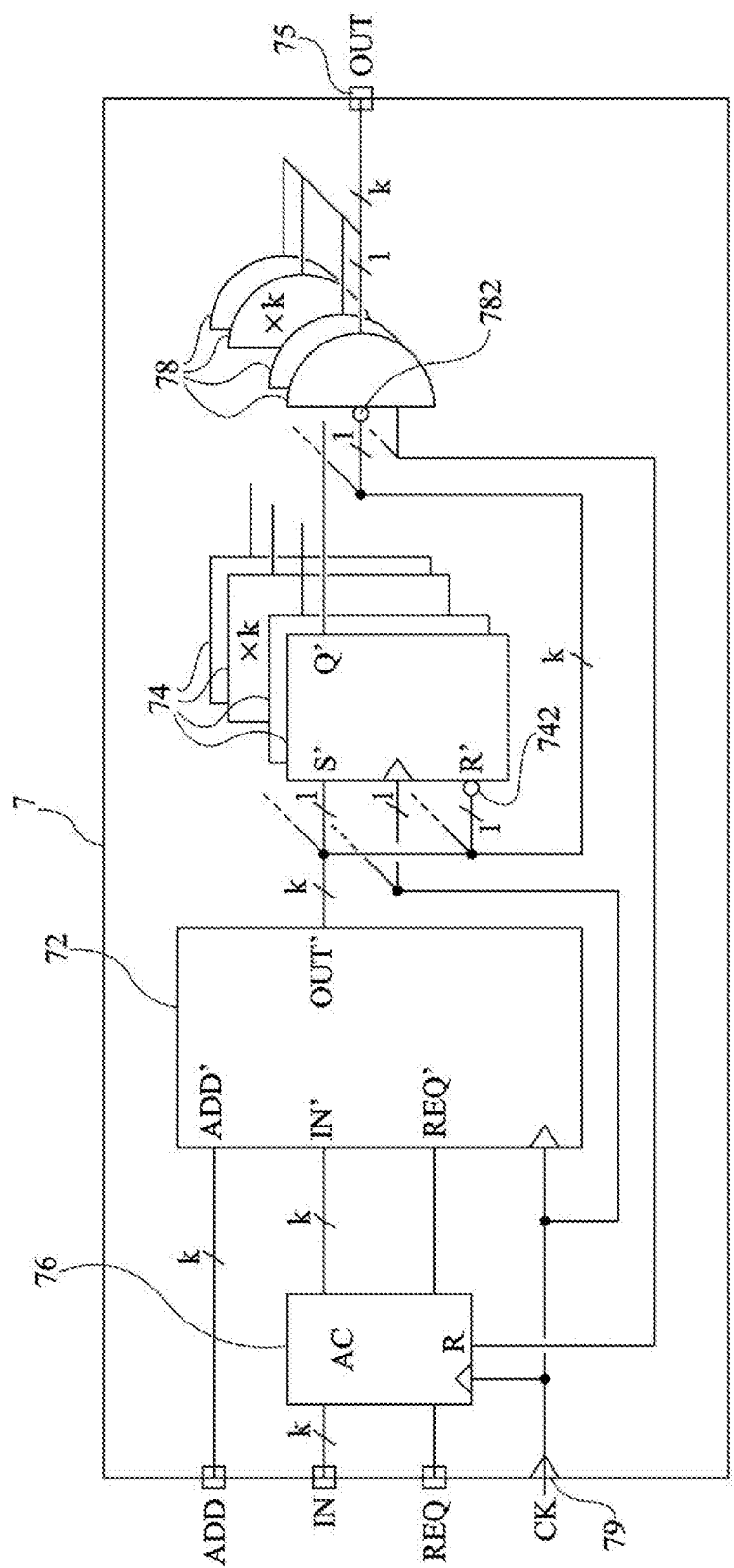
FIG. 6 very schematically shows another embodiment of a destructive readout memory circuit.

FIG. 6 very schematically shows in the form of blocks an embodiment of a non-volatile destructive readout or erasing readout memory circuit 7.

According to this embodiment, memory circuit 7 is based on the use of all or part of a flash memory.

In the example of FIG. 6, it is assumed that circuit 7 comprises a flash memory 72 organized in words of k bits, for example, thirty-two bits. However, all that is described hereafter transposes to a flash memory organized in words of any number k of bits.

This embodiment illustrates a version where certain elements of memory circuit 7 are shared, that is, are used whatever the processed word of memory 72.

In the same way as a usual flash memory, circuit 7 comprises an input ADD of an address bus, for example, of k equal thirty-two bits, a data input IN (data bus) over k bits, a control input REQ, indicative of the desired operation (programming, reading, erasing), and a clock input 79. Circuit 7 further comprises a data output 75 (OUT) (data bus) over k bits. To simplify the description, a terminal and the signal present on the terminal are intentionally referred to in the same way.

Address bus ADD is directly supplied to memory 72 (address bus input ADD'). Data bus IN and control signal REQ are processed by an arbitration circuit 76 (AC) before being supplied to memory 72 (data bus input IN' and control input REQ'). In an embodiment, circuit 76 also supplies, on a terminal R, a read enable signal. Circuit 76 also receives the clock signal from terminal 79.

The output bus OUT' of memory 72 supplies the data word read therefrom. The k read bits of the bus are individually processed by k RS-type flip-flops 74. Thus, each bit of the output bus OUT' of memory 72 is sent to an input S' for setting to 1 a flip-flop 74 and its inverse (inverter 742) is sent to the reset input R' of the same flip-flop 74.

Each flip-flop 74 is associated with a logic function 78 performing an AND-type combination. According to a simplified embodiment, each function 78 has two inputs combining the direct output Q' of each flip-flop 74 with the inverse of input S' of the flip-flop. In the shown embodiment, function 78 has three inputs. The direct output Q' of each flip-flop 74 is coupled, or connected, to a first input of gate 78. A second input of all the gates 78 receives the readout control signal supplied by circuit 76. A third input of each gate 78 is coupled, by an inverter 782, to input S' of the corresponding flip-flop 74.

The example of FIG. 6 considers the case of a NAND type flash memory, that is, a memory having its programming amounting to the writing of a 0 and having its erasing amounting to the writing of a 1. Thereby, the circuit portion downstream of memory 72 is similar to the embodiment of FIG. 4. However, what is described hereafter transposes to the inverse case (programming by the writing of a 1 on an erased state 0) by using the circuit portion downstream of memory 72 as in the embodiment of FIG. 5.

Further, it is assumed that output OUT' is not modified by a programming or by an erasing, but only by a reading. This last condition makes the taking into account of a control signal R at the level of gates 78 optional, as will be seen hereafter.

The function of circuit 76 is, based on the received request or control signal REQ, of controlling that in case of a reading, the data word is erased from memory 72 before it is delivered by memory circuit 7.

This amounts to applying the following rules:

in case of a programming request, transferring request REQ to input REQ', transferring non-modified data IN to input IN', and leaving signal R inactive (state 0). Output 75 then remains at state 0. State 0 of the output is, in the example of FIG. 4, forced by signal R. In a variation with a two-input AND gate, the fact for output OUT' to remain stable during a programming operation also provides that output OUT remains at state 0 (either terminal Q' is at state 0, or the output of inverter 782 is at 0).

in case of an erasing request, transferring request REQ to input REQ', without caring about bus IN (transferring it or not is of no importance), and leaving signal R inactive (state 0). Output 75 here again remains at state 0 for the same reasons as in the case of a programming.

in case of a readout request, modifying the request of input REQ into a readout request REQ' followed by a request REQ' for programming a 0, which amounts, at the level of memory 72, to successively performing a reading, a programming of a word entirely to 0, and again a reading (usually, in a flash memory, a programming is followed by a reading). Further, if a signal R is used, it is taken to the active state (1) at least during the clock cycle which follows the second readout step.

Figure 7:
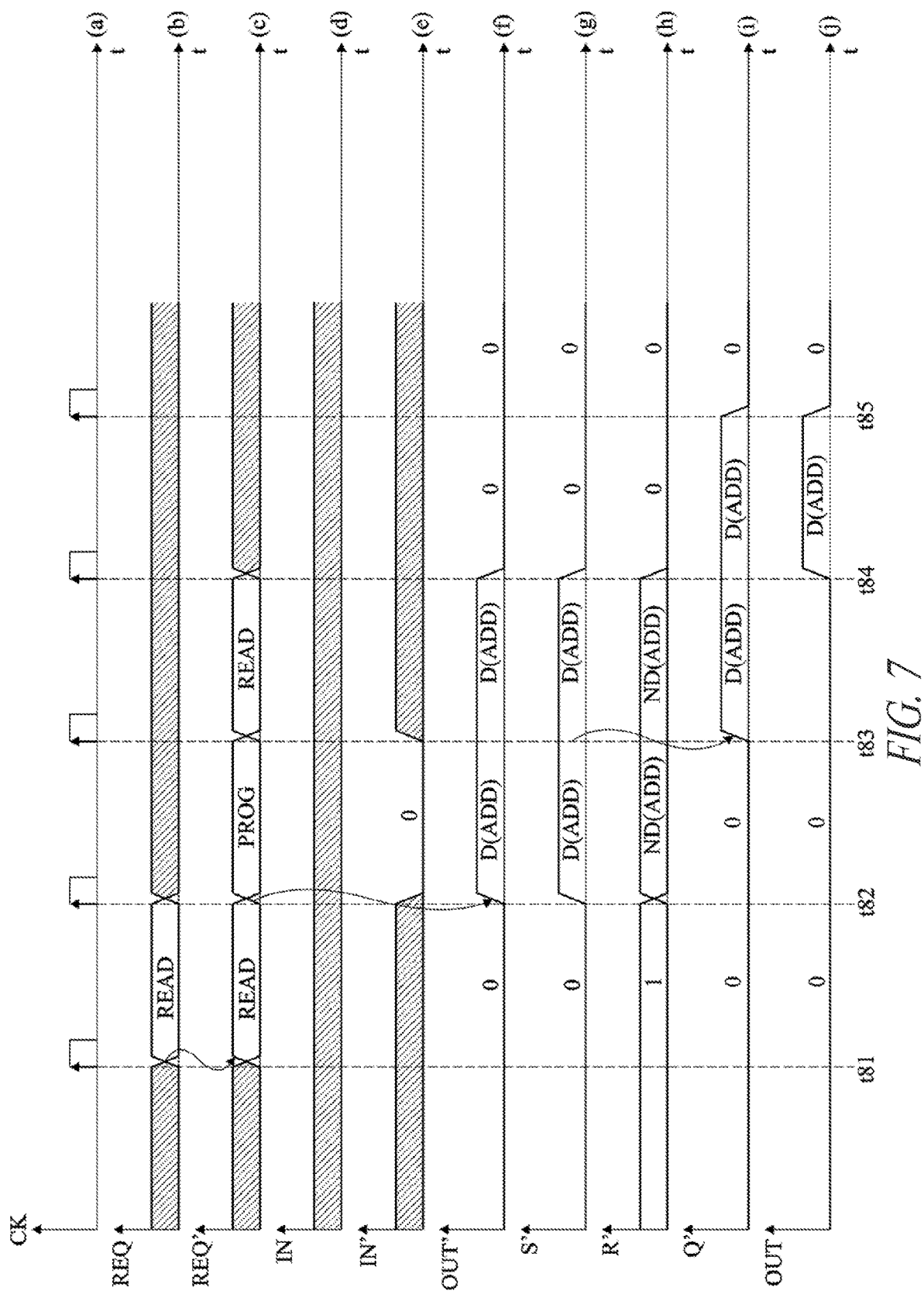
FIG. 7 illustrates, in timing diagrams, an example of the operation of the embodiment of FIG. 6.

FIG. 7 illustrates, in timing diagrams, the operation of the memory circuit of FIG. 6.

Signal 7(a) shows an example of a clock signal CK, applied to terminal 79. Signal 7(b) shows an example of a control signal REQ. Signal 7(c) shows the corresponding shape of signal REQ'. Signal 7(d) shows an example of data signal IN. Signal 7(e) shows the corresponding shape of signal IN'. Signal 7(f) shows the state of output terminal OUT' of memory 72. Signal 7(g) shows the corresponding states of the input terminals S' of flip-flops 74. Signal 7(h) shows the corresponding states of terminals R' of flip-flops 74. Signal 7(i) shows the states of the output terminals Q' of flip-flops 74. Signal 7(j) shows state OUT of output 75 of memory circuit 7.

For simplification, the propagation times in the logic functions are neglected in the representation of FIG. 7. Further, it is arbitrarily assumed for simplification that the time of processing by circuit 76 is immediate, that is, its propagation time is also neglected. In practice, according to the practical implementation of circuit 76, the transition is either almost immediate as illustrated, or takes one clock cycle. However, on the side of memory 72, each operation takes one clock cycle. Thus, a request received on input REQ has an effect on output OUT' at the rising edge starting the next cycle.

It is assumed that the memory is controlled by the rising edges of signal CK. The operation can thus be summed up in five clock cycles respectively starting with times t81, t82, t83, t84, and t85. As for the description of FIG. 3, indifferent or inoperative states are symbolized by hatchings.

An initial state at 0 of signal OUT' is arbitrarily considered to show switchings of signals S', R', and Q'. However, since the state of signal OUT' (and thus of signal OUT) does not change during requests for an erasing and a programming of memory 72, for signal OUT' to be initially at 1 does not modify the operation. Further, only the operation in readout mode is discussed, since the operation of a request REQ in erase or programming mode does not modify the states downstream of memory 72. Thus, the state of signal IN is inoperative during the entire operation described in relation with FIG. 7.

Since signal OUT' is initially at state 0, signal S' is at state 0, signal R' is at state 1, and signal Q' is at state 0. Output OUT is effectively at state 0.

At time t81, it is assumed that a readout request READ reaches input REQ and that the request is present during one cycle (between times t81 and t82) to be able to be taken into account by the memory at edge t82. Input ADD further receives the read address in memory 72, which is transmitted on its input ADD'.

Circuit 76 converts the request into three successive requests REQ' for a reading READ, a programming PROG, and a reading READ. Each request REQ' lasts for one cycle. Further, during the programming cycle (between times t82 and t83), signal IN' is forced to state 0 by circuit 76.

At time t82, the first request for reading from memory 72 results in the supplying onto output OUT' the data D(ADD) stored at address ADD. As a result, input S' takes state D(ADD) or more specifically the inputs S' of the k different flip-flops 74 take the respective states of the bits of data D(ADD) and input R' takes the inverse state ND(ADD). Output Q' remains at 0, as well as output OUT. Further, to prepare the programming of state 0 at address ADD, circuit 76 sets signal IN' with all the bits at state 0.

At time t83, the programming of value 0 is performed in memory 72 at address ADD. On the side of output OUT' (and thus inputs S' and R'), nothing changes since the actual programming does not modify the state of output OUT'. However, value D(ADD) is transferred to terminal Q'. Value OUT does not change. Further, circuit 76 generates the second readout request REQ' (still at address ADD).

At time t84, the second readout request results in the fact that output OUT' takes state 0 (the memory word has been erased). Inputs S' and R' also take state 0. Since input R' is now at state 0, the output of inverter 782 is at state 1 (all its bits are at state 1). Accordingly, output 75 reflects the state of output Q', and thus supplies the read word D(ADD).

From as soon as time t85 (next cycle), output OUT' switches to state 0, which makes word D(ADD) of output OUT disappear.

It can thus be seen that the data are erased from memory 72 before being supplied to output 75 of circuit 7.

In the case of FIG. 6, if signal R is used, it is switched to state 1 by circuit 76 only during the cycle between times t84 and t85. Although it is not indispensable with the described memory type, this is a security and may further be used according to the operation of memory 72.

Figure 8:
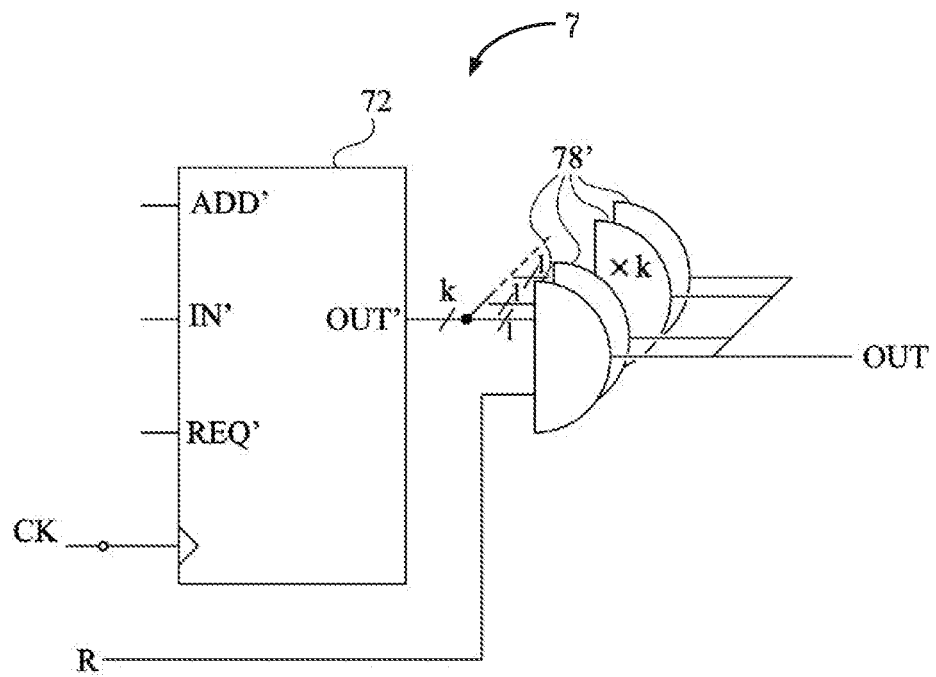
FIG. 8 very schematically and partially shows another embodiment of a destructive readout memory circuit.

FIG. 8 very schematically and partially shows in the form of blocks another embodiment of a non-volatile destructive readout or erasing readout memory circuit 7.

As compared with the embodiment of FIG. 6, flip flops 74 and AND gates 78 are replaced with AND gates 78' combining, one by one, the output bits OUT' of cell 72 with signal R. The respective outputs of gates 78' directly form output OUT.

Figure 9:
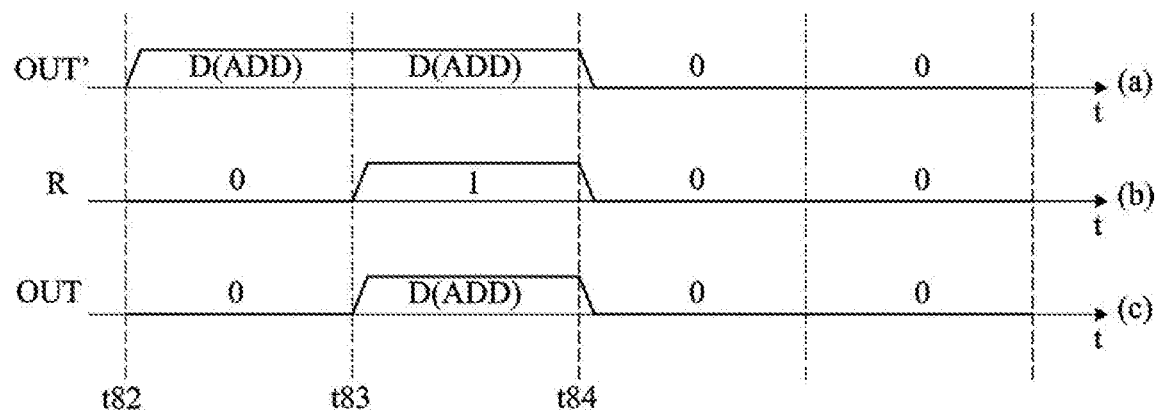
FIG. 9 illustrates, in timing diagrams, an example of the operation of the embodiment of FIG. 8.

FIG. 9 illustrates, in timing diagrams, the operation of the memory circuit of FIG. 8.

For simplification, only certain timing diagrams of FIG. 7 are shown in FIG. 9, only between times t82 and t84.

Signal 9(a) shows the state of output terminal OUT' of cell 72. Signal 9(b) shows the state of signal R generated by circuit 76 (FIG. 6). Signal 9(c) shows the state of terminal OUT.

According to this embodiment, signal R is activated (state 1) between times t83 and t84. Thus, output OUT takes value D(ADD) between times t83 and t84.

An advantage of the described memory circuit is that it is particularly simple to form from any memory.

An advantage of the described memory circuit is that it requires no additional control input-output or other with respect to the inputs/outputs of a non-volatile memory cell.

An advantage of the described embodiments is that they require no modification of the readout control circuits with respect to usual memory cells. Indeed, it is sufficient to replace a memory cell in the application with the described memory circuit, the inputs/outputs being identical.

The described memory circuit is compatible with an organization in bytes, words, arrays, etc. as a usual memory. However, in most applications, the number of bits which is desired to be used with a destructive readout is small, for example, in the order of one kilobit with respect to a memory of several tens of megabytes which generally equips microprocessor electronic circuits. Accordingly, it may be preferred to form the destructive readout memory with a number of dedicated memory circuits.

Various embodiments and variations have been described. It will be understood by those skilled in the art that certain features of these various embodiments and variations may be combined, and other variations will occur to those skilled in the art. In particular, although an embodiment based on the use of a memory cell with a programming to state 0 (blank state 1), a memory cell with a blank state 0 and programmable to state 1 may be used by adapting the logic functions.

Finally, the practical implementation of the described embodiments and variations is within the abilities of those skilled in the art based on the functional indications given hereabove. In particular, the selection of the synchronization signal (periodic or not) depends on the application.

Such alterations, modifications, and improvements are intended to be part of this disclosure, and are intended to be within the spirit and the scope of the present disclosure.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, convolutional accelerators, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various embodiments and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A volatile memory circuit, comprising:
a first flip-flop;
a second flip-flop having a set input coupled to an output of the first flip-flop;
first logic circuitry, which, in operation, logically combines an output of the second flip-flop, a readout control signal, and information representative of the output of the first flip-flop; and
second logic circuitry, which, in operation, logically combines the readout control signal and a cell programming control signal, wherein an input of the first flip-flop is coupled to an output of the second logic circuitry.

2. The circuit of claim 1, wherein the second logic circuitry includes circuitry of an XOR-type.

3. The circuit of claim 1, wherein the first logic circuitry includes logic circuitry of an AND type, and, in operation, receives an inverted output of the first flip-flop.

4. The circuit of claim 1, wherein the output of the second logic circuitry is coupled to a reset input of the first flip-flop.

5. The circuit of claim 1, wherein the first logic circuitry includes logic circuitry of a NAND type.

6. The circuit of claim 1, wherein the output of the second logic circuitry is coupled to a set input of the first flip-flop.

7. The circuit of claim 1, wherein, in operation, a reading of a state stored in the memory circuit triggers a forcing by the first logic circuitry of an output of the circuit to a constant state.

8. The circuit of claim 1, wherein, in operation, outputting a reading of content of the first flip-flop by the circuit is preceded by an erasing of the content of the first flip-flop.

9. The circuit of claim 1, wherein an input of the first logic circuitry is coupled to a readout control input of the circuit, which, in operation, receives the readout control signal.

10. The circuit of claim 1, wherein the flip-flops are of RS type.

11. The circuit of claim 1, comprising a clock input coupled to clock inputs of the first and second flip-flops.

12. A system, comprising:
one or more processing circuits; and
one or more memories coupled to the one or more processing circuits, the one or more memories including a read-once memory circuit having a plurality of memory cells, each of the plurality of memory cells of the read-once memory including:
a first flip-flop;
a second flip-flop having a set input coupled to an output of the first flip-flop;
first logic circuitry, which, in operation, logically combines an output of the second flip-flop, a readout control signal, and information representative of the output of the first flip-flop to generate an output of the read-once memory; and
second logic circuitry, which in operation, logically combines the readout control signal of the read-once memory circuit and a cell programming control signal of the read-once memory circuit, wherein an input of the first flip-flop is coupled to an output of the second logic circuitry.

13. The system of claim 12, wherein the second logic circuitry includes an XOR gate.

14. The system of claim 12, wherein the output of the second logic circuitry is coupled to respective reset inputs of the first flip-flops of the plurality of memory cells.

15. The system of claim 12, wherein the output of the second logic circuitry is coupled to respective set inputs of the first flip-flops of the plurality of memory cells.

16. The system of claim 12, wherein the first logic circuitry of a memory cell of the plurality of memory cells includes an AND gate, which, in operation, receives an inverted output of the first flip-flop of the memory cell of the plurality of memory cells.

17. The system of claim 12, wherein the read-once memory, in operation, responds to receipt of a command to read content stored in the first flip-flops of the plurality of memory cells by:
resetting the first flip-flops of the plurality of memory cells; and
subsequently outputting content of the second flip-flops of the plurality of memory cells.

18. The system of claim 17, wherein, in operation, the read-once memory resets the second flip-flops of the plurality of memory cells after outputting the content of the second flip-flops of the plurality of memory cells.

19. A method, comprising:
storing data in a first flip-flop of a memory cell;
transferring the data to a second flip-flop of the memory cell, the second flip-flop having a set input coupled to an output of the first flip-flop;

logically combining an output of the second flip-flop, a readout control signal, and information representative of the output of the first flip-flop to generate an output of the memory cell;

logically combining the readout control signal and a cell programming control signal, and providing a result of the logical combining to an input of the first flip-flop; and in response to receipt of a read command,
resetting the first flip-flop; and
outputting the data.

20. The method of claim 19, comprising resetting the second flip-flop after outputting the data.

\* \* \* \* \*